(12) United States Patent
Suzuki (10) Patent No.: US 6,335,865 B1
(45) Date of Patent: Jan. 1, 2002

(54) PRINTED WIRING BOARD

(75) Inventor: Mitsuo Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,478

(22) Filed: Apr. 20, 2000

(30) Foreign Application Priority Data

Apr. 21, 1999 (JP) ............................................. 11-114201

(51) Int. Cl.[7] .................................................. H05K 1/18

(52) U.S. Cl. ...................... 361/763; 361/502; 361/794; 174/51

(58) Field of Search ................................. 361/763, 502, 361/812, 818, 773, 795, 794, 764, 766, 762, 780; 174/51, 138 G (56) References Cited

U.S. PATENT DOCUMENTS

| 5,488,540 A | * | 1/1996 | Hatta | 361/794 |
| 5,663,870 A | * | 9/1997 | Kerndlmaier | 361/63 |
| 5,847,451 A | * | 12/1998 | Ohtaki et al. | 257/48 |
| 6,111,474 A | * | 8/2000 | Nibe | 333/26 |

* cited by examiner

Primary Examiner—Jeffrey Gaffin
Assistant Examiner—Hung Bui
(74) Attorney, Agent, or Firm—Foley & Lardner (57) ABSTRACT

In a printed wiring board, slotted portions are provided in a grounding layer so as to be positioned under communication lines print-wired on a printed wiring board. Capacitors are provided between the slotted portions and external connecting terminals. Two units of oppositely directed magnetic flux of an equal level occur for the slotted portions by common mode currents flowing in the communication lines. These two units of magnetic flux offset each other to lower a common mode noise level.

3 Claims, 8 Drawing Sheets

PRINTED WIRING BOARD

BACKGROUND OF THE INVENTION

This invention relates to a printed wiring board having a structure for improving electromagnetic environmental compatibility (hereinafter abbreviated to EMC).

With a recent development of a digital technique, degree of integration of LSI (Large Scale Integrated Circuit) and density of a printed wiring board have been increased in recent years, and operating speed thereof has also been increased.

Such a high-speed digital circuit includes a digital signal containing many high-frequency components. Consequently, it is necessary to suppress radioactive noise due to unnecessary radiation for a printed wiring board having a digital circuit.

Furthermore, since resistance of the printed wiring board against external noise has become lower due to the increase in the density and operating speed of digital devices, it is necessary to take measures for improving noise resistance of a printed wiring board.

In order to improve EMC of such digital devices and circuit, a common mode choke conventionally has been mounted onto the printed wiring board.

Figure 1:
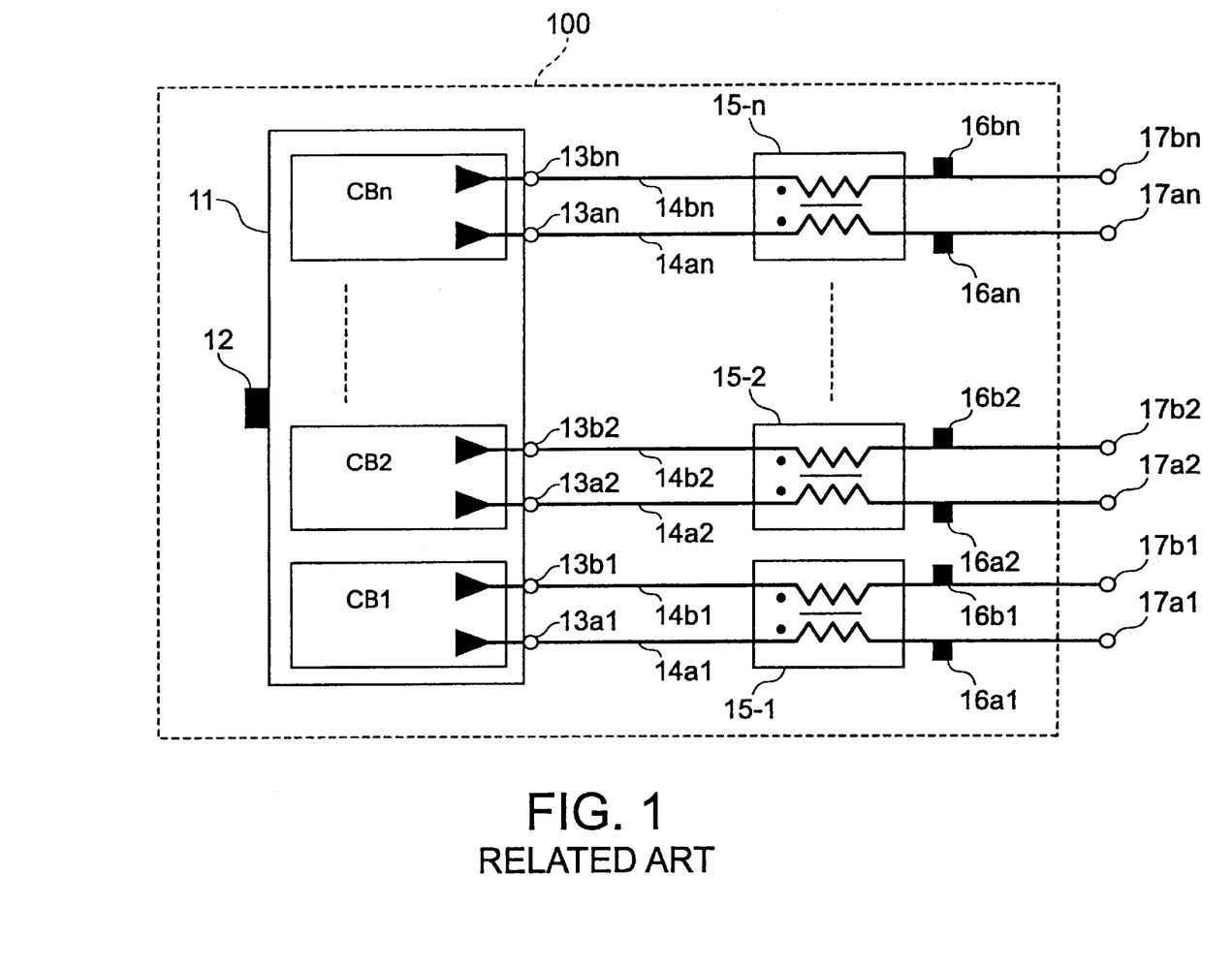
FIG. 1 shows a printed wiring board according to the related art.

In FIG. 1, a reference numeral 11 denotes a LSI. The LSI has circuit blocks CB1–CBn which are connected to pins 13$a$1, $b$1 to 13$an, bn$ for communication lines and a common E (earth or ground) pin 12.

The pins 13$a$1, $b$1 to 13$an, bn$ for the communication lines are connected to common mode chokes 15-1 to 15-$n$ for preventing common mode noise via the communication lines 14$a$1, $b$1 to 14$an, bn$.

Capacitors 16$a$1, $b$1 to 16$an, bn$ having high-frequency characteristics are connected to portions of the communication lines between the common mode chokes 15-1 to 15-$n$ and terminals 17$a$1, $b$1 to 17$an, bn$. On the other hand, the other terminals of the capacitors 16$a$1, $b$1 to 16$an, bn$ are connected to a solid E (earth) layer 32 illustrated in FIG. 2.

Figure 2:
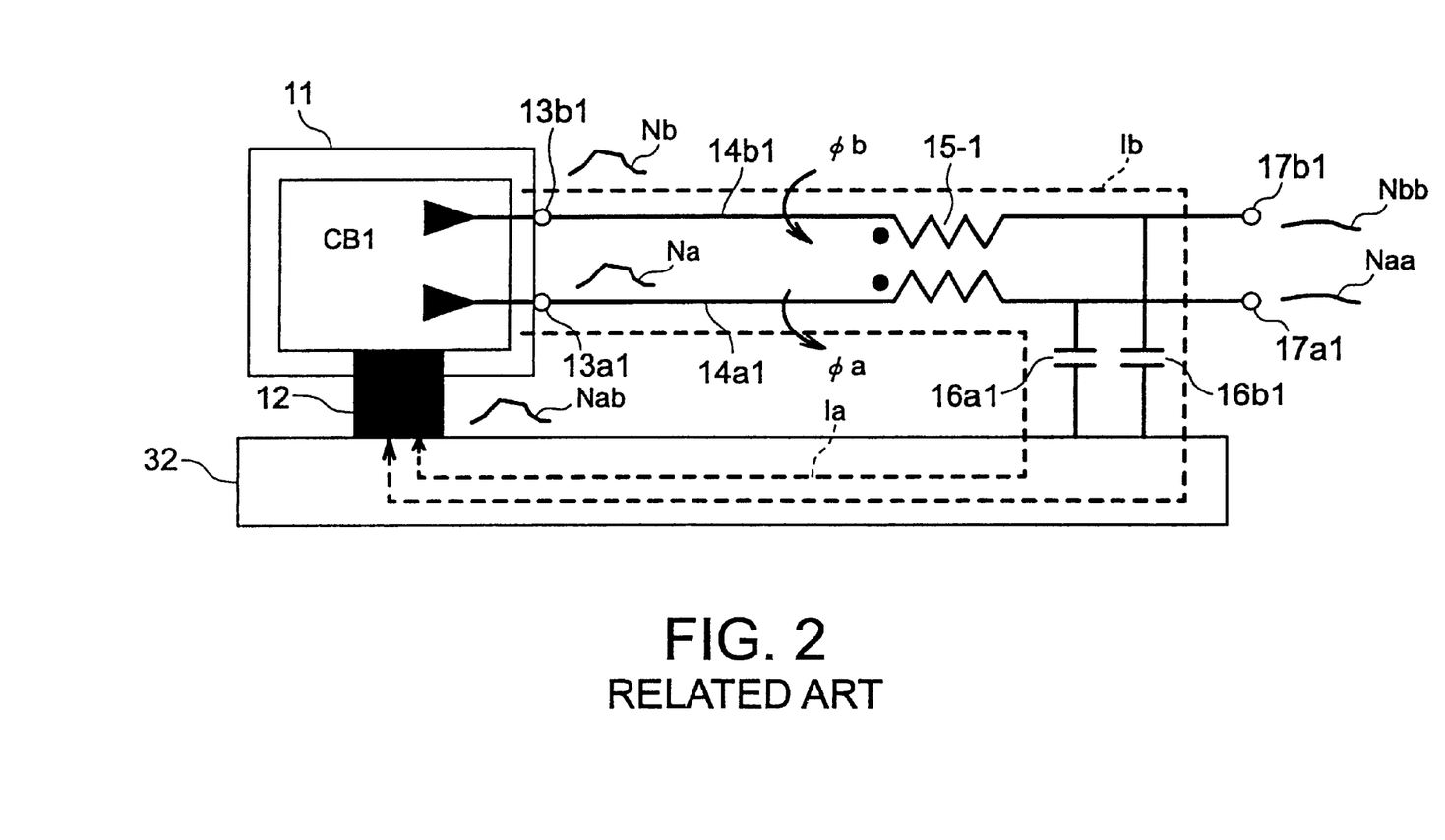
FIG. 2 illustrates common mode currents flowing in the printed wiring board of FIG. 1.

Although a pair of communication lines 14$a$1, 14$b$1 alone are shown in FIG. 2, similar common mode noise may occur in the other communication lines. Reference numeral Nab in the same drawing denotes common mode noise occurring in the E pin 12. When the common mode noise Nab generates in the E pin 12, common mode noise Na appears for the communication line 14$a$1, while common mode noise Nb generates for the communication line 14$b$1.

Under this circumstance, a common mode current Ia passing through the communication line 14$a$1 flows along a path which takes a round via the common mode choke 15-1, capacitor 16$a$1, solid E layer 32 and communication pin 13$a$1. Thereby, the common mode current Ia generates magnetic flux $\phi$a.

In the meantime, a common mode current Ib passing through the communication line 14$b$1 flows along a path which takes a round via the common mode choke 15-1, capacitor 16$b$1, solid E layer 32 and communication pin 13$b$1. Thereby, the common mode current Ib generates magnetic flux $\phi$b.

Since the units of magnetic flux a, b generate in the reverse directions to each other, a, b offset each other. In consequence, the common mode noises Na, Nb are attenuated with the result that levels of the common mode noises at the terminals 17$a$1, 17$b$1 are lowered.

As described above, expensive common mode chokes must be used to suppress the occurrence of common mode noise of the digital circuit and to improve EMC in the related printed wiring board.

SUMMARY OF THE INVENTION

It is therefore an object of this invention to provide a printed wiring board which is capable of suppressing common mode noise without using expensive parts, such as, common mode chokes as EMC improving devices.

According to an aspect of the present invention, the printed wiring board capable of solving the above-mentioned problems has a laminate formed of a pattern-wired layer on which plural communication lines are print-wired, an insulating layer, and a grounding layer, the printed wiring board including slotted portions (groove portions) provided in the sections of the grounding layer which are positioned under two parallel-printwired communication lines, and capacitors provided between the slotted portions and external connecting terminals of the printed wiring board, and connected at one terminal thereof to the communication lines, and at the other terminal thereof to the grounding layer through a through hole provided in the insulating layer.

According to another aspect of the present invention, the width of each of the slotted portions of the first-described printed wiring board is determined on the basis of a distance between the two parallel-print-wired communication lines.

According to still another aspect of the present invention, each of the capacitors in the first-described printed wiring board may be formed of the pattern-wired layer, an insulator provided on the insulating layer and having a dielectric constant different from that of the insulating layer, and the grounding layer.

DESCRIPTION OF PREFERRED EMBODIMENT

An embodiment of the present invention will now be described with reference to the drawings.

Figure 3:
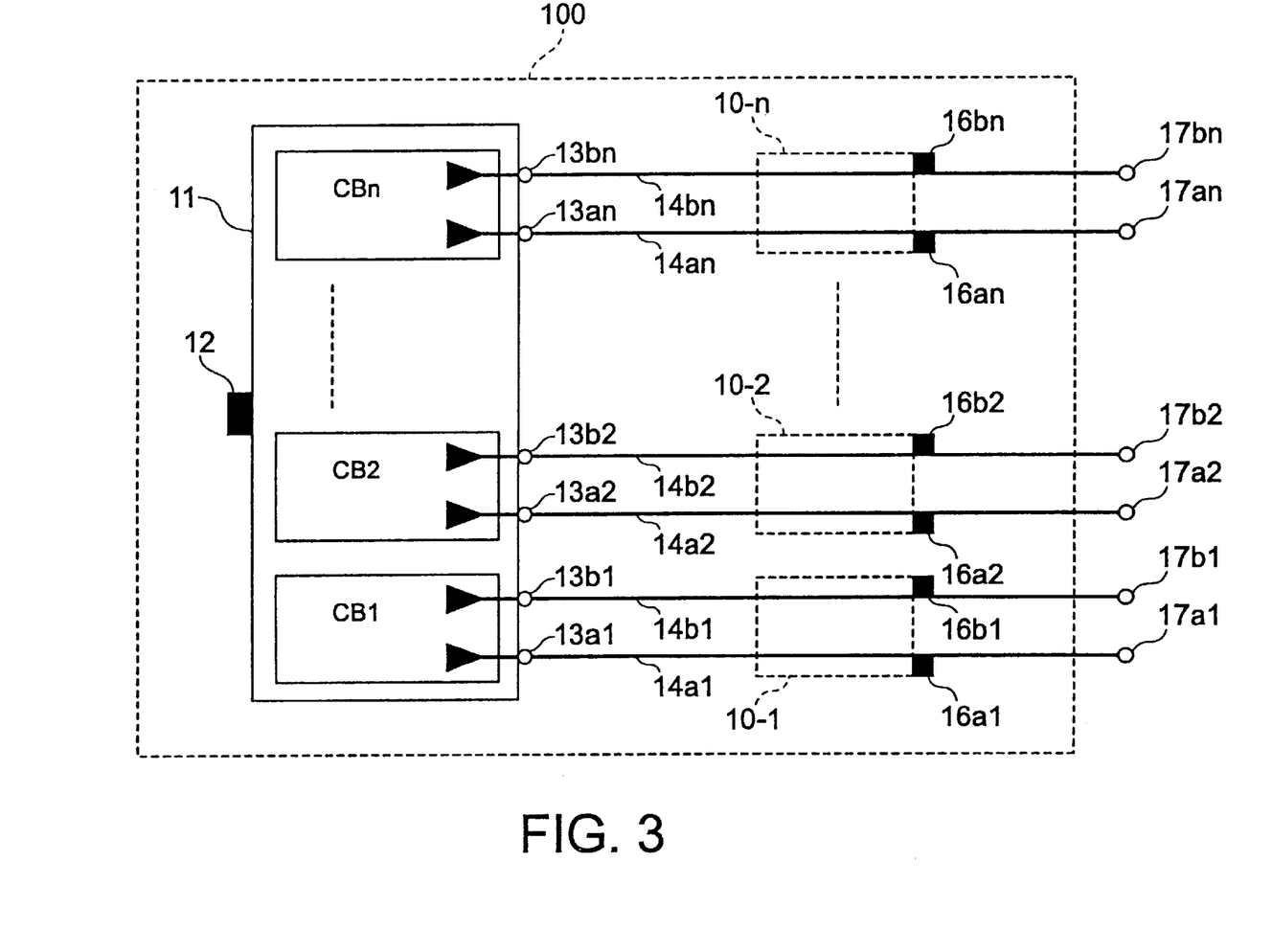
FIG. 3 illustrates an embodiment of the printed wiring board according to the present invention.

FIG. 3 is a drawing showing an embodiment of the printed wiring board according to the present invention. Referring to this drawing, the elements common to the related art printed wiring board illustrated in FIG. 1 are designated by the same reference numerals, and therefore, a description thereof will be omitted.

In FIG. 3, reference numerals 10-1 to 10-$n$ denote slotted portions (or groove portions) provided in a solid E layer 32.

The slotted portions 10-1 to 10-n are provided so that they are positioned under paired print-wired communication lines 14a1, b1 to 14an, and bn.

Figure 4A:
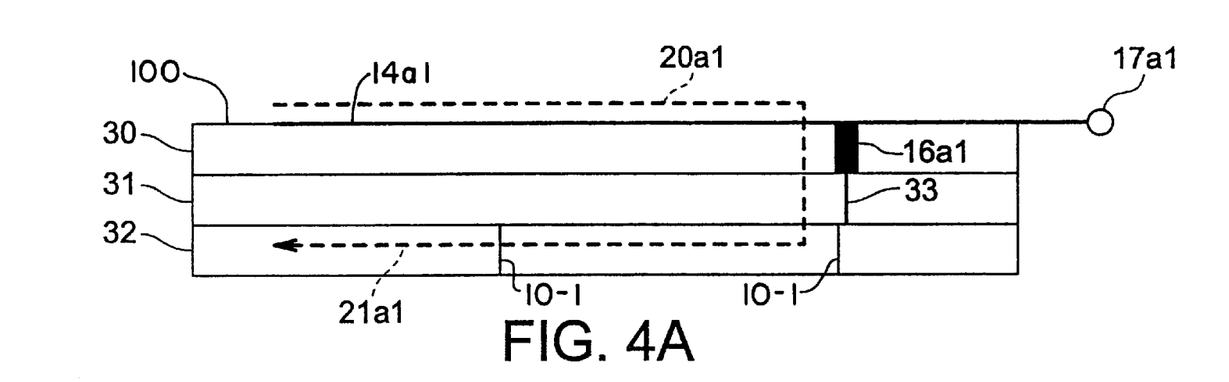
FIGS. 4A and 4B illustrate common mode currents flowing in the embodiment of the printed wiring board.
Figure 4B:
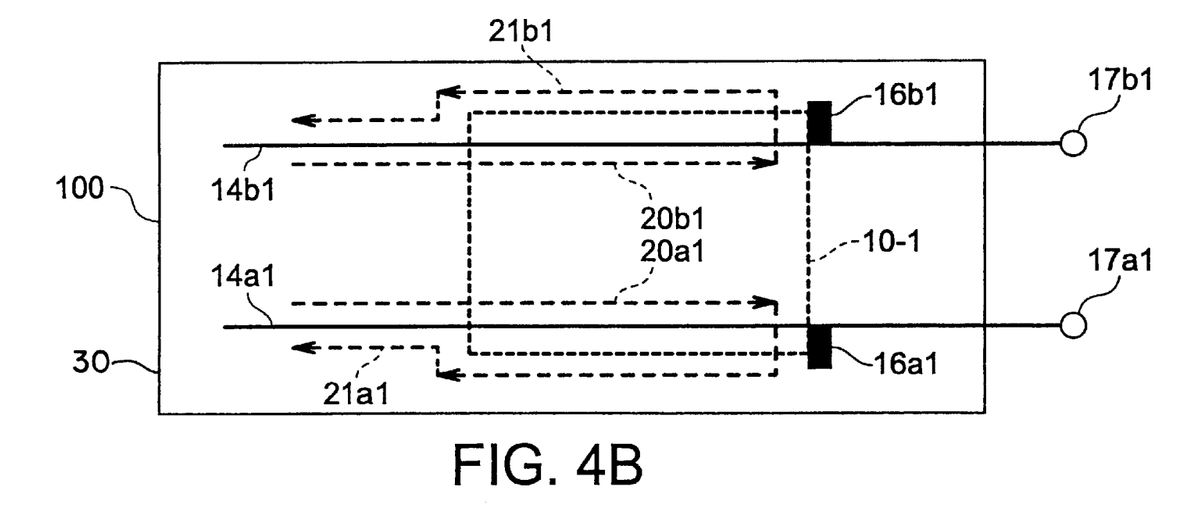

FIGS. 4A and 4B illustrate common mode currents 20a1, b1 flowing along the communication lines 14a1, b1, and common mode currents 21a1, b1 flowing through the solid E layer 32. The same applies to the other pairs of communication lines. Therefore, the relative description of same will be omitted.

In FIG. 4A, a printed wiring board 100 is formed by laminating a pattern-wired layer 30, on which a pattern wire and parts are provided, an insulating layer 31, and a solid E layer 32.

With such a structure, the communication line 14a1 is print-wired on the pattern-wired layer 30. Further, a capacitor 16a1 is connected to the communication line 14a1, and is coupled to the solid E layer 32 via a through hole 33 of the insulating layer 31 at the other terminal thereof. In this case, the communication line 14b1 and a capacitor 16b1 are also connected in the same manner.

In FIG. 4B, the common mode currents 20a1, b1 flow along the paths illustrated in the same drawing, and form loop currents with currents 21a1, b1 flowing through the solid E layer 32 with the currents bypassing the slotted portion 10-1.

Figure 5:
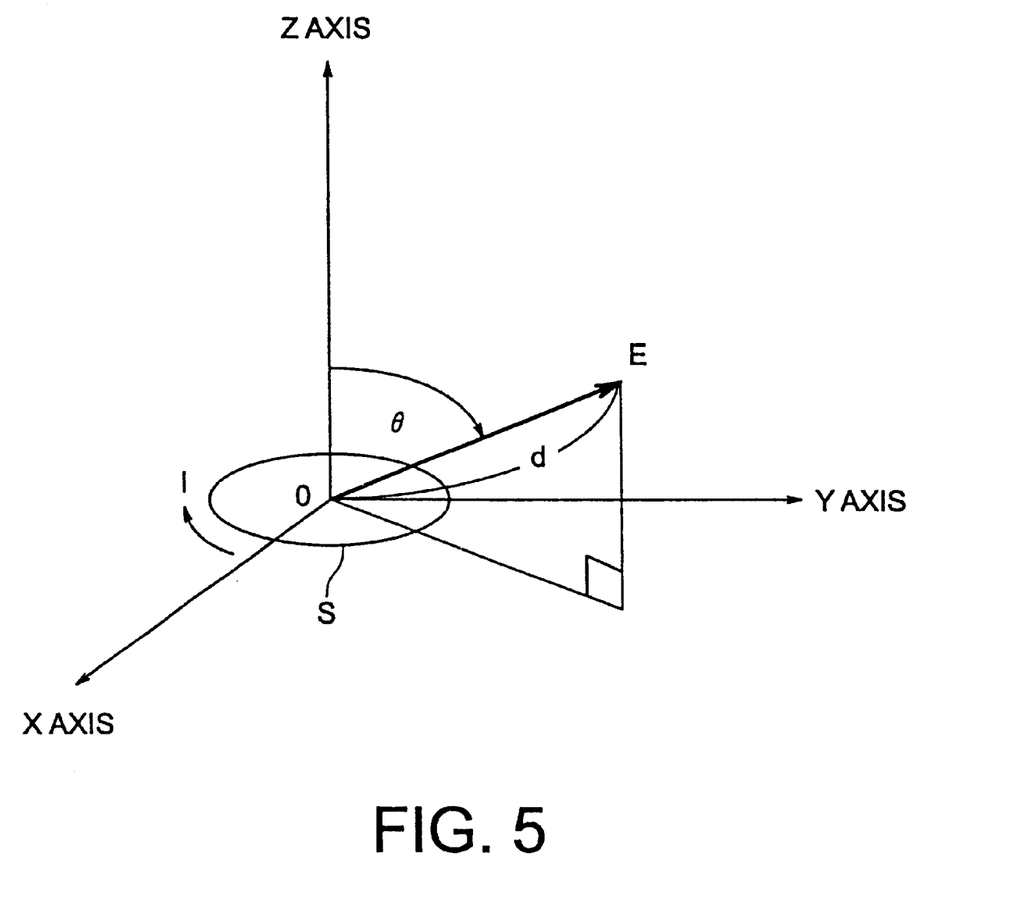
FIG. 5 is a schematic diagram describing the intensity of an electromagnetic wave occurring due to loop currents shown in FIG. 4.

FIG. 5 is a schematic diagram describing the intensity of electromagnetic waves occurring when the common mode currents 20a1, b1 flow.

The intensity E of the electromagnetic wave in a position spaced by a distance (d) from the center of a loop area S formed by a frequency (f) and a current I is defined as follows.

$$E = K \times (S \times I \times f^2 / d) \sin \theta$$

wherein S represents an area ($m^2$) of a current loop, I a loop current value (A), (f) a frequency (Hz) of the current loop, (d) a distance (m) from the center of the current loop, $\theta$ a radiation angle (rad) with respect to a Z-axis of the electromagnetic wave, and K a constant.

Accordingly, the area S, current I and frequency (f) must be reduced, and the distance (d) must be increased in order to reduce the intensity of unnecessary radiation due to one loop current.

However, two loop currents flow adjacently to each other in the slotted portion 10-1. Consequently, electro-magnetic waves having the same intensity occur in the reverse directions and offset or cancel each other. Therefore, the common mode current having a certain level is permitted.

Figure 6:
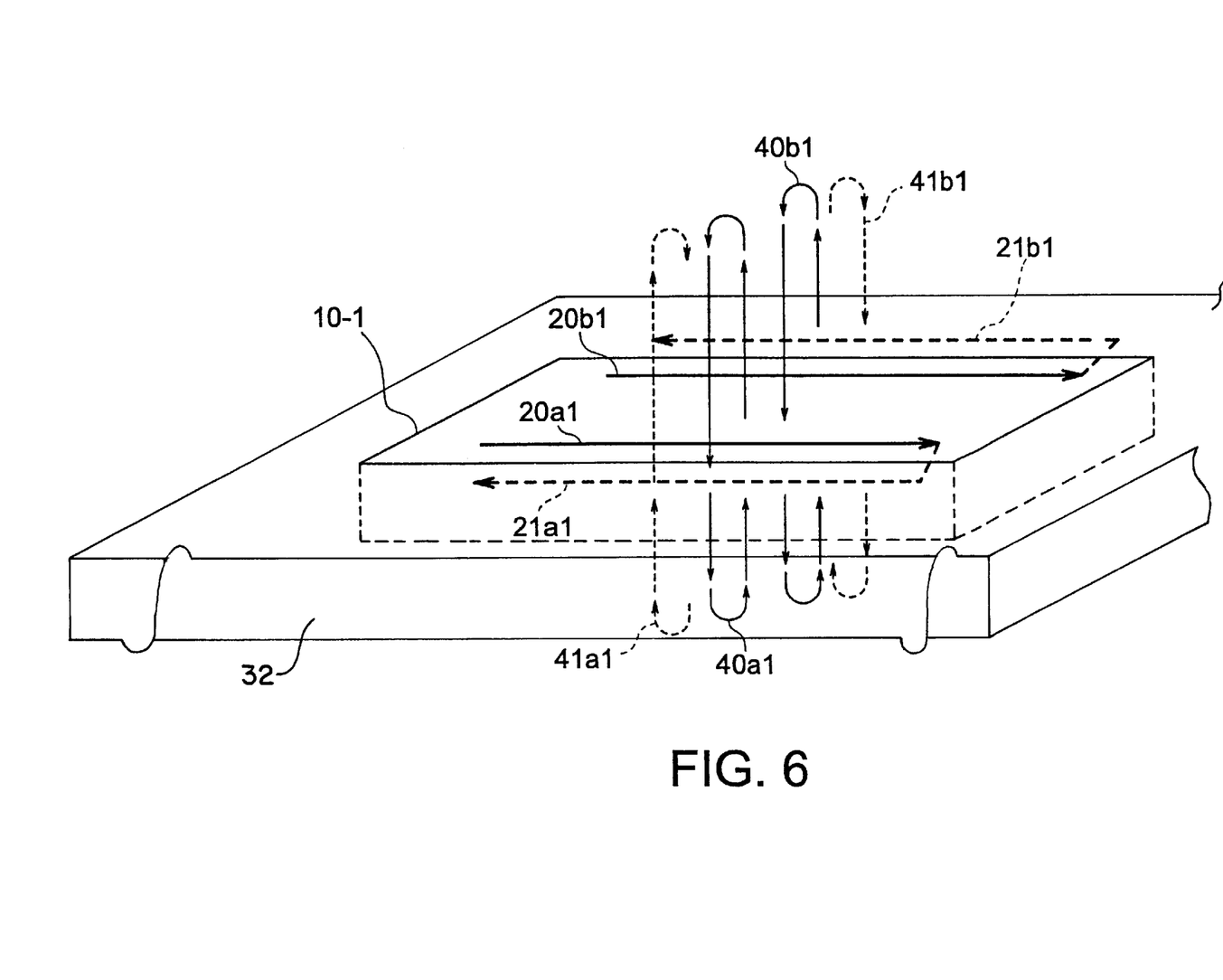
FIG. 6 illustrates magnetic flux occurring due to the loop currents shown in FIG. 4.

FIG. 6 is a drawing illustrating magnetic flux occurring due to loop currents formed by the common mode currents 20a1, b1 flowing in the communication lines 14a1, b1 and the common mode currents 21a1, b1 flowing through the solid E layer 32.

Referring to the drawing, the loop current formed by the common mode currents 20a1, 21a1 generates magnetic flux 40a1 in the slotted portion 10-1. The current 21a1 flowing through the solid E layer 32 generates magnetic flux 41a1. However, this magnetic flux passes through the solid E layer 32.

Therefore, this magnetic flux is shielded by the solid E layer 32 and attenuated or decayed. Thereby, the intensity thereof is lowered. Consequently, the magnetic flux generated by the loop currents 20a1, 21a1 is constituted mainly by the magnetic flux 40a1 occurring in the slotted portion 10-1.

Magnetic flux 40b1, 41b1 generates in the same manner as mentioned above, due to a loop current formed by the common mode currents 20b1, 21b1. However, the magnetic flux 41b1 is attenuated due to a shielding effect of the solid E layer 32.

As a result, the magnetic flux occurring due to this loop current is mainly constituted by the magnetic flux 40b1 occurring in the slotted portion 10-1.

Since noise levels occurring for the communication lines 14a1, b1 are equal to each other, the common mode currents 20a1, 20b1 are equal to each other, and the magnetic flux 40a1, 40b1 generated by the currents is also equal to each other.

The directions of the magnetic flux 40a1, 40b1 passing through the slotted portion 10-1 is opposite to each other, and the levels of the same magnetic flux are equal. Therefore, the magnetic flux 40a1, 40b1 offsets or cancels each other, and has the same effect as that obtained when the magnetic flux $\phi a$, $\phi b$ occurring due to the common mode choke 15-1 offsets or cancels each other. This causes the common mode noise level to lower.

The mutual influence of units of magnetic flux in a case where two pairs of communication lines are arranged adjacently to each other will now be described.

Figure 7:
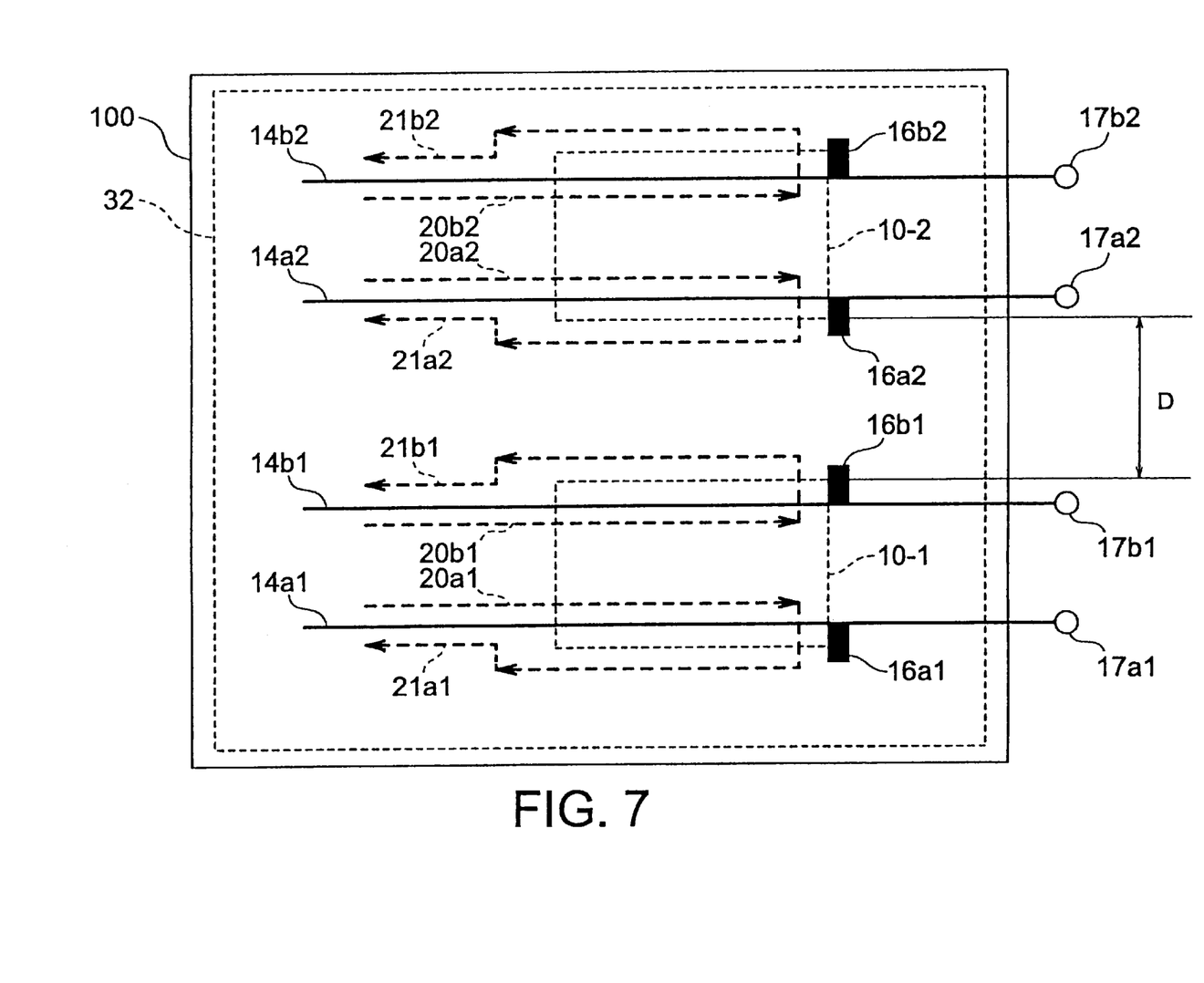
FIG. 7 shows two pairs of signal lines print wired adjacently to each other on the printed wiring board of FIG. 3, and common mode currents.
Figure 8:
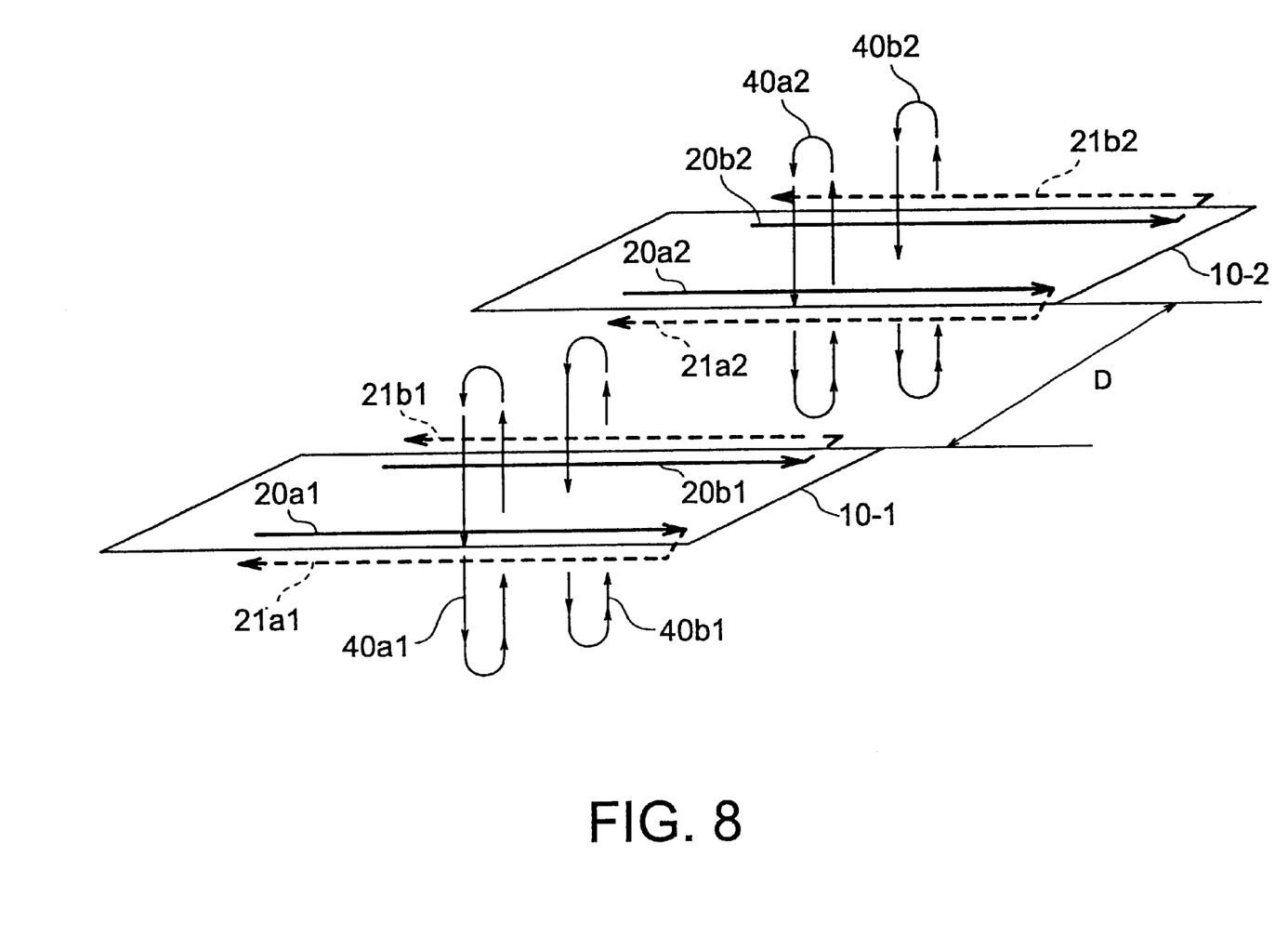
FIG. 8 illustrates magnetic flux occurring due to the common mode currents of FIG. 7.

FIG. 7 illustrates paired adjacently arranged communication lines 14a1, b1 and 14a2, b2, and FIG. 8 illustrates magnetic flux occurring due to a loop current flowing in each communication line.

Subsequently, description will be made about mutual influence of the magnetic flux when two units of the communication lines are arranged adjacent to each other with reference to FIGS. 7 and 8.

In FIG. 8, the slotted portions 10-1 and 10-2 are provided so as to be spaced from each other by a distance D. Magnetic flux 40b1 is generated by the common mode current 20b1 on the side of the slotted portion (or groove portion) 10-1 which is adjacent to the slotted portion 10-2.

Magnetic flux 41b1 occurring due to the common mode current 21b1 is attenuated by the shielding effect of the solid E layer 32, as mentioned above and shown in FIG. 6. Consequently, only the magnetic flux 40b1 remains.

On the side of the slotted portion 10-2 which is adjacent to the slotted portion 10-1, magnetic flux 40a2 is generated by a current 20a2, and magnetic flux 41a2 (not shown) is generated by a current 21a2.

In this event, when the distance between the slotted portions 10-1, 10-2 becomes short, magnetic fluxes 41b1, 41a2 are in the opposite directions and cancel each other. In consequence, a difference occurs between the sum of an attenuation amount based on the offsetting of magnetic fluxes 41b1, 41a2 and an attenuation amount based upon the shielding effect of the solid E layer 32, and an attenuation amount based upon the shielding effect alone of the magnetic flux 41a1.

Due to the influence of this difference, a difference occurs between the magnitude of the magnetic flux 40a1 and that of the magnetic flux 40b1, and the offsetting amounts decrease.

The distance D is increased to such a level that it does not cause the magnetic flux 41b1, 41a2 to influence upon each other due to the shielding effect of the solid E layer. Thereby, the units of magnetic flux 40a1, 40b1 and 40a2, 40b2 offset or cancel each other, and a common mode noise can be suppressed.

In the above embodiment, a printed wiring board using capacitors having high-frequency characteristics has been described. Instead of the capacitors, it is also possible to hold in common the portion of the high-frequency characteristics of the parts used so as to heighten the noise resistance of the digital circuit which corresponds to the capacity thereof.

According to the present invention, EMC can be improved by a pattern designing method in which a slotted structure is provided in a grounding layer without using expensive EMC improving parts. As a result, an economical printed wiring board can be obtained.

Since a slotted structure is employed without using electric parts, such as, common mode chokes, the reliability of the digital circuit-mounted printed wiring board can be enhanced.

What is claimed is:

1. A printed wiring board, comprising:

a grounding layer;

an insulating layer which is formed on the grounding layer;

a pattern wired layer which is formed on the insulating layer; and a pair of communication lines which are provided on the pattern wired layer;

said grounding layer having a slotted portion which is positioned under said pair of communication lines, said slotted portion having a length shorter than that or said pair of communication lines and a width greater than a distance between said pair of communication lines, a pair of side walls of said slotted portion being positioned outside of said pair of communication lines when said printed wiring board is seen from above;

said printed wiring board further comprising:

a pair of capacitors which are provided between the slotted portion of said grounding layer and a pair of external connecting terminals of the printed wiring board, said pair of external connecting terminals being connected to said pair of communication lines, each of said pair of capacitors being connected to each of said pair of communication lines at one terminal thereof, and each of said pair of capacitors being coupled to the grounding layer via a through hole at another terminal thereof.

2. A printed wiring board as claimed in claim 1, wherein: the through hole is provided in the insulating layer.

3. A printed wiring board as claimed in claim 1, wherein: the communication lines are connected to a circuit block in an integrated circuit, the integrated circuit being arranged on the printed wiring board.

* * * * *